(12) United States Patent
Wang

(10) Patent No.: US 9,853,603 B2
(45) Date of Patent: Dec. 26, 2017

(54) POWER AMPLIFIER FOR AMPLIFYING RADIO FREQUENCY SIGNAL

(71) Applicant: Microsoft Corporation, Redmond, WA (US)

(72) Inventor: Zhancang Wang, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/543,635

(22) Filed: Nov. 17, 2014

(65) Prior Publication Data

US 2016/0142020 A1 May 19, 2016

(30) Foreign Application Priority Data

Nov. 14, 2014 (CN) .......................... 2014 1 0643351

(51) Int. Cl.
*H03G 3/20* (2006.01)
*H03F 1/02* (2006.01)
(Continued)

(52) U.S. Cl.
CPC ......... *H03F 1/0288* (2013.01); *H03F 1/0222* (2013.01); *H03F 1/565* (2013.01);
(Continued)

(58) Field of Classification Search
CPC ...................................................... H03F 3/211
(Continued)

(56) References Cited

U.S. PATENT DOCUMENTS 6,441,688 B1    8/2002  Lau et al.
6,794,933 B2    9/2004  Gurvich et al.
(Continued)

FOREIGN PATENT DOCUMENTS

CN    201426111 Y    3/2010
EP    1612932 A1     1/2006
(Continued)

OTHER PUBLICATIONS

Yan, Jonmei Johana, "High Efficiency Broadband Envelope-Tracking Power Amplifiers", Jul. 17, 2014, Available at: http://www.escholarship.org/uc/item/3cv3d9ks#page-1.
(Continued)

*Primary Examiner* — Khanh V Nguyen
*Assistant Examiner* — Khiem Nguyen

(57) ABSTRACT

Power amplifiers for amplifying a radio frequency signal are provided. The power amplifier may include an envelope tracking power supply, a carrier amplifier coupled with the envelope tracking power supply and configured to amplify the radio frequency signal, an input matching network configured to split the amplified radio frequency signal from the carrier amplifier such that one part of the amplified radio frequency signal passes along a peak amplifier path and another part of the amplified radio frequency signal passes along an impedance transformer path, a peak amplifier coupled with the envelope tracking power supply and configured to amplify the one part of the amplified radio frequency signal from the input matching network, an impedance transformer configured to perform impedance transformation on the other part of the amplified radio frequency signal from the input matching network, an output matching network configured to combine the output of the peak amplifier and the impedance transformer, wherein the peak amplifier is configured to be switched off in a lower power mode and switched on in a high power mode based at least in part on an input power level of the radio frequency signal. With the claimed solutions, more powerful and efficient power amplifiers that are capable of operating over broader frequency ranges may be achieved.

17 Claims, 10 Drawing Sheets

(51) Int. Cl.
H03F 1/56 (2006.01)
H03F 3/19 (2006.01)
H03F 3/191 (2006.01)

(52) U.S. Cl.
CPC .............. *H03F 3/19* (2013.01); *H03F 3/191* (2013.01); *H03F 2200/102* (2013.01); *H03F 2200/222* (2013.01); *H03F 2200/387* (2013.01); *H03F 2200/451* (2013.01)

(58) Field of Classification Search
USPC .............. 330/286, 302, 295, 136, 297, 285
See application file for complete search history.

(56) References Cited

U.S. PATENT DOCUMENTS

| | | | |
|---|---|---|---|
| 7,078,976 | B2 | 7/2006 | Blednov |
| 7,761,065 | B2 | 7/2010 | Drogi et al. |
| 8,461,931 | B1 | 6/2013 | Bayruns et al. |
| 8,749,306 | B2 | 6/2014 | Pengelly |
| 2005/0083117 | A1* | 4/2005 | Kim ............... H03F 1/0211 330/51 |
| 2008/0030276 | A1 | 2/2008 | Hau et al. |
| 2011/0037516 | A1 | 2/2011 | Nejati et al. |
| 2013/0241656 | A1 | 9/2013 | Tajima et al. |
| 2013/0241657 | A1 | 9/2013 | Cho et al. |
| 2014/0312977 | A1* | 10/2014 | Kaczman ........... H03F 1/0222 330/295 |

FOREIGN PATENT DOCUMENTS

| | | |
|---|---|---|
| EP | 2728741 A1 | 5/2014 |
| WO | 2010041181 A1 | 4/2010 |

OTHER PUBLICATIONS

Moon, et al., "A Multimode/Multiband Envelope Tracking Transmitter With Broadband Saturated Amplifier", In IEEE Transactions on Microwave Theory and Techniques, vol. 59 , Issue: 12, Dec. 2011, 11 pages.

Cho, et al., "Doherty Power Amplifier Based on the Class-F Load Network", Jul. 17, 2014, Available at: http://onlinepresent.org/proceedings/vol16_2012/3.pdf.

Ahn, et al., "Design of a High-Efficiency and High-Power Inverted Doherty Amplifier", In IEEE Transactions on, Microwave Theory and Techniques, vol. 55, Issue: 6, Jun. 2007, 7 pages.

Barrio, et al., "Novel Architecture for LTE World phones", In IEEE Antennas and Wireless Propagation Letters, Jan. 16, 2014, 4 pages.

"International Search Report & Written Opinion Issued in PCT Application No. PCT/US2015/059802", dated Jan. 14, 2016, 11 Pages.

"International Preliminary Report on Patentability Issued in PCT Application No. PCT/US2015/059802", dated Jan. 23, 2017, 8 Pages.

"Second Written Opinion Issued in PCT Application No. PCT/US2015/059802", dated Sep. 28, 2016, 7 Pages.

International search Report and Written Opinion issued in PCT Application No. PCT/US2015/059802, dated Jan. 14, 2016, 11 pages.

* cited by examiner

POWER AMPLIFIER FOR AMPLIFYING RADIO FREQUENCY SIGNAL

RELATED APPLICATIONS

This application claims priority to Chinese Application No. 201410643351.4, filed on Nov. 14, 2014, and entitled "POWER AMPLIFIER FOR AMPLIFYING RADIO FREQUENCY SIGNAL." This application claims the benefit of the above-identified application, and the disclosure of the above-identified application is hereby incorporated by reference in its entirety as if set forth herein in full.

FIELD OF THE INVENTION

Example embodiments of the present disclosure generally relate to signal amplification. More particularly, example embodiments of the present disclosure relate to power amplifiers ("PAs") for amplifying a radio frequency ("RF") signal.

BACKGROUND OF THE INVENTION

The following description of background art may include insights, discoveries, understandings or disclosures, or associations together with disclosures not known to the relevant art prior to the present disclosure but provided by the present disclosure. Some such contributions of the present disclosure may be specifically pointed out below, while other such contributions of the present disclosure will be apparent from their context.

With the evolution of mobile communication systems, various wireless communication techniques have been standardized and released, such as Global System for Mobile Communications ("GSM"), Enhanced Data rates for GSM Evolution ("EDGE"), Universal Mobile Telecommunications System ("UMTS"), High Speed Link Packet Access ("HSPA"), Long Term Evolution ("LTE"), Long Term Evolution Advanced ("LTE-A") and etc. Each of these standards has a particular signal specification, modulation types, transmission power requirements, and dedicated operating frequency bands, which are different from one geographic area to another across the globe. For instance, according to the existing wireless communication standards and frequency planning, there are a couple of frequency bands for mobile devices to operate on, for example, 850, 900, 1800, and 1900 MHz bands in 2G GSM standard, 850, 900, 1800, 1900 and 2100 MHz bands in 3G standards, 700, 800, 850, 900, 1700, 1800, 1900, 2100, and 2600 MHz bands in 3.9G Frequency Division Duplex ("FDD")-LTE standards, and 2300, 2600 and 2700 MHz bands in 3.9G time division duplex ("TDD")-LTE standards.

In order to provide wireless communication users with global roaming functionality under different frequency bands as exampled above, mobile devices that support various communication standards to co-exist and interoperability between multiple frequency bands, which are generally referred to as Multi-Mode Multi-Band ("MMMB") devices, are emerging. Such an MMMB-enabled mobile device generally includes an MMMB RF PA circuitry, in which a separated low voltage and impedance RF PA is arranged for each operating frequency range. For example, for dual frequency band operations, the existing MMMB RF PA requires two separated low voltage and impedance PAs. Therefore, in order to support multiple frequency band operations, there would be correspondingly multiple separated low voltage and impedance PAs. However, it would be hard to dispose such number of separated low voltage and impedance PAs in a single mobile device, which inevitably increases the size, cost, and complexity of the mobile device. The same may hold true for signal amplifications that are carried out at a base station, which may be also referred to as a Node B, an evolved Node B ("eNB") and etc in different wireless communication systems.

Therefore, there is a need for more powerful and efficient power amplifiers that are capable of operating over broader frequency ranges.

SUMMARY OF THE INVENTION

The following presents a simplified summary of the present disclosure in order to provide a basic understanding of some aspects of the present disclosure. It should be noted that this summary is not an extensive overview of the present disclosure and that it is not intended to identify key/critical elements of the present disclosure or to delineate the scope of the present disclosure. Its sole purpose is to present some concepts of the present disclosure in a simplified form as a prelude to the more detailed description that is presented later.

According to an aspect of the present disclosure, there is provided a power amplifier for amplifying a radio frequency signal. The power amplifier comprises an envelope tracking power supply. The power amplifier also comprises a carrier amplifier coupled with the envelope tracking power supply and configured to amplify the radio frequency signal. The power amplifier further comprises an input matching network configured to split the amplified radio frequency signal from the carrier amplifier such that one part of the amplified radio frequency signal passes along a peak amplifier path and another part of the amplified radio frequency signal passes along an impedance transformer path. The power amplifier also comprises a peak amplifier coupled with the envelope tracking power supply and configured to amplify the one part of the amplified radio frequency signal from the input matching network. The power amplifier further comprises an impedance transformer configured to perform impedance transformation on the other part of the amplified radio frequency signal from the input matching network. The power amplifier additionally comprises an output matching network configured to combine the output of the peak amplifier and the impedance transformer, wherein the peak amplifier is configured to be switched off in a lower power mode and switched on in a high power mode based at least in part on an input power level of the radio frequency signal.

In one embodiment, the output of the envelope tracking power supply is a combination of an alternating current component and a direct current component, and wherein the alternating current component is provided by a linear modulator of the envelope tracking power supply and the direct current component is provided by an external direct current power supply.

In another embodiment, the input matching network is configured to split the amplified radio frequency signal according to a ratio of an input impedance of the peak amplifier path to an input impedance of the impedance transformer path.

In yet another embodiment, the input matching network is configured to split the amplified radio frequency signal according to an operation of the peak amplifier when it is switched on.

In a further embodiment, the input matching network and the output matching network are matched with each other to produce one or more resonances such that one or more LC pairs are omitted.

In one embodiment, the input matching network and the output matching network are implemented by lumped element networks comprising lumped elements, by distributed parameters, or by a combination of both.

In another embodiment, the one part of the amplified radio frequency signal passing along the peak amplifier path and the other part of the amplified radio frequency signal passing along the impedance transformer are mutually out of phase by an arbitrary value from 0 to 180 degree.

According to an aspect of the present disclosure, there is provided a multi-stage power amplifier for amplifying a radio frequency signal, comprising an envelope tracking power supply and each stage comprising a carrier amplifier coupled with the envelope tracking power supply and configured to amplify the radio frequency signal, an input matching network configured to split the amplified radio frequency signal from the carrier amplifier such that one part of the amplified radio frequency signal passes along a peak amplifier path and another part of the amplified radio frequency signal passes along an impedance transformer path, a peak amplifier coupled with the envelope tracking power supply and configured to amplify the one part of the amplified radio frequency signal from the input matching network, an impedance transformer configured to perform impedance transformation on the other part of the amplified radio frequency signal from the input matching network, and an output matching network configured to combine the output of the peak amplifier and the impedance transformer for input to a next stage, wherein the peak amplifier is configured to be switched off in a lower power mode and switched on in a high power mode based at least in part on an input power level of the radio frequency signal.

According to another aspect of the present disclosure, there is provided a power amplifier for amplifying a radio frequency signal, comprising an envelope tracking power supply, a power splitting node configured to split the radio frequency signal such that a plurality of respective parts of the radio frequency signal pass along a plurality of respective sub-amplifying circuit paths, and a power combining node configured to combine the respective output of the plurality of respective sub-amplifying circuit paths. Each of the plurality of respective sub-amplifying circuit paths comprises a carrier amplifier coupled with the envelope tracking power supply and configured to amplify the radio frequency signal, an input matching network configured to split the amplified radio frequency signal from the carrier amplifier such that one part of the amplified radio frequency signal passes along a peak amplifier path and another part of the amplified radio frequency signal passes along an impedance transformer path, a peak amplifier coupled with the envelope tracking power supply and configured to amplify the one part of the amplified radio frequency signal from the input matching network, an impedance transformer configured to perform impedance transformation on the other part of the amplified radio frequency signal from the input matching network, and an output matching network configured to combine the output of the peak amplifier and the impedance transformer, wherein the peak amplifier is configured to be switched off in a lower power mode and switched on in a high power mode based at least in part on an input power level of the radio frequency signal.

According to an aspect of the present disclosure, there is provided a power amplifier for amplifying a radio frequency signal. The power amplifier comprises an envelope tracking power supply and a plurality of sub-amplifying circuit which are connected in a combination of series and parallel to form a multi-nested structure. Each sub-amplifying circuit comprises a carrier amplifier coupled with the envelope tracking power supply and configured to amplify the radio frequency signal, an input matching network configured to split the amplified radio frequency signal from the carrier amplifier such that one part of the amplified radio frequency signal passes along a peak amplifier path and another part of the amplified radio frequency signal passes along an impedance transformer path, a peak amplifier coupled with the envelope tracking power supply and configured to amplify the one part of the amplified radio frequency signal from the input matching network, an impedance transformer configured to perform impedance transformation on the other part of the amplified radio frequency signal from the input matching network, an output matching network configured to combine the output of the peak amplifier and the impedance transformer, wherein the peak amplifier is configured to be switched off in a lower power mode and switched on in a high power mode based at least in part on an input power level of the radio frequency signal.

According to yet another aspect of the present disclosure, there is provided a method for amplifying a radio frequency signal. The method comprises amplifying the radio frequency signal using a carrier amplifier. The method further comprises splitting the amplified radio frequency signal from the carrier amplifier using an input matching network such that one part of the amplified radio frequency signal passes along a peak amplifier path and another part of the amplified radio frequency signal passes along an impedance transformer path. The method also comprises amplifying the one part of the amplified radio frequency signal from the input matching network using a peak amplifier in the peak amplifier path. The method additionally comprises performing impedance transformation on the other part of the amplified radio frequency signal using an impedance transformer in the impedance transform path. The method also comprises combining the output of the peak amplifier and the impedance transformer using an output matching network, wherein the carrier amplifier and peak amplifier are powered by an envelope tracking power supply and the peak amplifier is configured to be switched off in a lower power mode and switched on in a high power mode based at least in part on an input power level of the radio frequency signal.

A person skilled in the art may understand, based upon the teaching of the present disclosure, that the aspects and example embodiments of the present disclosure as described above may be utilized separately or in combination and different combining forms may be constituted to target at least some intentions of the present disclosure as mentioned in the following.

According to the embodiments of the present disclosure, the input and output matching networks may be flexibly arranged to form various structures, such as multi-stage, parallel, series, or multi-nested structures, and thereby the resulting power amplifier may tolerate more output power back offs for high Peak To Average Power Ratio ("PAPR") application scenarios, e.g., beyond 3G wireless communication and 4G. Further, from the angle of the technical implementation, by means of LC pair resonance, the matching network complexity reduction and LC removal for much more compact design may also be achieved.

In addition, out phased signal split in the peak amplifier path and the impedance transformer path may be configured as an arbitrary angle or phase from 0-180 degree rather than the traditional fixed 90 degree with quarter wavelength elements, which is advantageous to tune for wider bandwidth and efficiency optimization. Further, it may cancel the out phasing distortion at full power output by inherent linearization obtained by the out phasing splitting feature.

Further, as compared to the parallel arrangement in the prior art, with the serial connection between the envelope tracking carrier and peak amplifiers of the present disclosure, natural power gain increase and profile reduction in the whole transmitter may be obtained. Also, phase matching between the peak amplifier and the impedance transformer is easier to achieve than two active devices in parallel, e.g., the carrier amplifier and the peak amplifier in the conventional Doherty power amplifier, because the short term and long term memory effects of two active devices are more difficult to be compensated and linearized. Additionally, as shown in the accompanying figures, the serial connection of carrier and peak amplifiers may form a line-up arrangement, which may enable the driver stage, that is, the carrier amplifier to further improve the efficiency characteristics of the transmitter chain. Thereby, it may bring much more line-up efficiency improvement as compared to applying envelope tracking power supply to a single amplification stage.

BRIEF DESCRIPTION OF THE DRAWINGS

The embodiments of the present disclosure are presented in the sense of examples and their advantages are explained in greater detail below with reference to the accompanying drawings, in which.

DETAILED DESCRIPTION OF EMBODIMENTS

The present disclosure will now be described more fully hereinafter with reference to the accompanying drawings, in which certain embodiments of the present disclosure are shown. This disclosure may, however, be embodied in many different forms and should not be construed as limited to the embodiments set forth herein; rather, these embodiments are provided by way of example so that this disclosure will be thorough and complete, and will fully convey the scope of the present disclosure to those skilled in the art. Like numbers refer to like elements throughout the specification.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The discussion above and below in respect of any of the aspects of the present disclosure is also in applicable parts relevant to any other aspect of the present disclosure.

Given the ever increasing demand for efficiency, a Doherty amplifier has become a popular power amplifier in mobile communication applications for 3G and beyond. For a better understanding of the present disclosure, the following will give a brief introduction to the Doherty amplifier 100 in association with FIG. 1.

Figure 1:
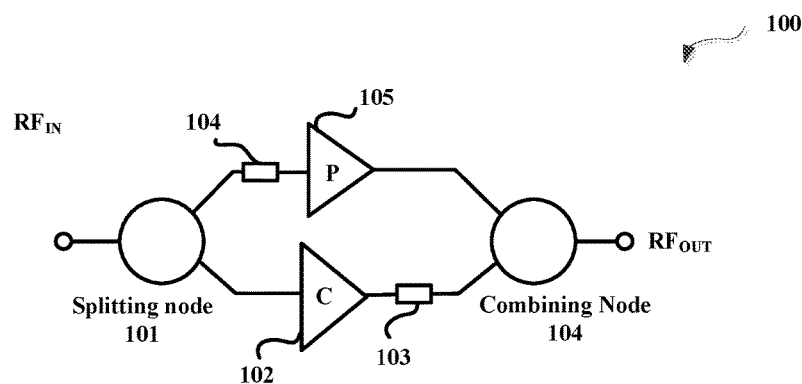
FIG. 1 is a schematic diagram illustrating a conventional Doherty amplifier.

As illustrated in FIG. 1, a modulated RF input signal $RF_{IN}$ is fed to a splitting node 101, which may be also referred to as a power splitter and splits the RF input signal $RF_{IN}$ along a "carrier path" (lower part as illustrated) and a "peak path" (upper part as illustrated). The carrier path generally includes a carrier ("C") power amplifier 102 followed by a transmission line ("TL") 103 that is sized to provide a 90° phase shift at or near the center frequency of the operating bandwidth. The carrier path terminates at a combining node 104, which may be coupled with a transformer and ultimately coupled to an antenna (not shown). The peak path includes a transmission line ("TL") 105 that is sized to provide a 90° phase shift at or near the center frequency of the operating bandwidth followed by a peak ("P") power amplifier 106. As such, the RF input signal $RF_{IN}$ provided along both the carrier path and the peak path are 90° out of phase with one another when they are amplified by the respective carrier and peak power amplifiers 102 and 106. Similar to the carrier path, the peak path terminates at the combining node 104.

In the above traditional Doherty amplifier 100, the carrier power amplifier 102 generally provides a fixed DC supplied class A/B (or B) amplifier, and the peak power amplifier 106 provides a class C amplifier. During operation, the RF input signal $RF_{IN}$ is split and directed along the carrier and peak paths to the respective carrier and peak power amplifier 102 and 106.

The Doherty amplifier 100 is generally considered to have two operation modes. In the first operation mode, only the carrier power amplifier 102 is switched on and operates to amplify the RF input signal $RF_{IN}$. In the second operation mode, both the carrier power amplifier 102 and the peak power amplifier 106 operate to amplify the RF input signal $RF_{IN}$ in the respective carrier and peak paths. The threshold between the two operation modes corresponds to a magnitude of RF input signal $RF_{IN}$ in the carrier path where carrier power amplifier 102 becomes saturated.

In the first operation mode, the levels of the RF input signal $RF_{IN}$ are below the threshold and the carrier power amplifier 102 amplifies the portion of the RF input signal $RF_{IN}$ in the carrier path. In the meantime, the peak power amplifier 106 is switched or turned off and consumes little power. In this way, only the carrier power amplifier 102 supplies an amplified RF input signal $RF_{IN}$ to the combining node 104. Therefore, the overall efficiency of the Doherty amplifier is determined predominantly by the efficiency of the carrier power amplifier 102.

In contrast, in the second operation mode, the levels of RF input signal $RF_{IN}$ are at or above the threshold and the carrier power amplifier 102 is saturated and delivers its maximum power to the combining node 104 via the transmission line 103. Further, as the RF input signal $RF_{IN}$ rises above the given threshold, the peak power amplifier 106 turns on and begins amplifying the portion of the RF input signal $RF_{IN}$ that flows along the peak path. As the RF input signal $RF_{IN}$ continues to rise above the given threshold, the peak power amplifier 106 delivers more power to the combining node 104 until the peak power amplifier 106 also becomes saturated. By arranging the transmission lines 103 and 104 in the carrier and peak paths, the amplified signals in each path arrive at the combining node 104 in phase and can be reactively combined to form the RF output signal $RF_{OUT}$. It can be seen that in the second operation mode, both the carrier and peak power amplifiers 102 and 106 are delivering amplified signals to the combining node 104 and the overall output power for the Doherty amplifier 100 is effectively the sum of the output power of the carrier and peak power amplifiers 102 and 106.

Although the Doherty amplifier 100 is relatively efficient as compared to traditional linear amplifier e.g. class A/AB/B, it has a relatively limited bandwidth of operation. As a consequence, for communication devices that only need to support a single communication band, the limited operating bandwidth of the Doherty power amplifier causes no problems. However, modern communication devices are often required to support various communication standards that employ different modulation techniques over a wide range of operating frequencies, which cannot be easily achieved by the traditional Doherty amplifier 100 without any improvements.

As discussed before at the background portion, in order to provide the MMMB-enabled mobile devices and base stations, developers and designers often employ multiple power amplifier chains for the different communication bands, which are not cost-efficient and hard to implement due to complexity of circuit arrangements, shrinking size of the mobile devices and base station, etc.

In view of the above, the present disclosure proposes a circuit structure based on the traditional Doherty amplifier, which is discussed below with reference to FIG. 2.

Figure 2:
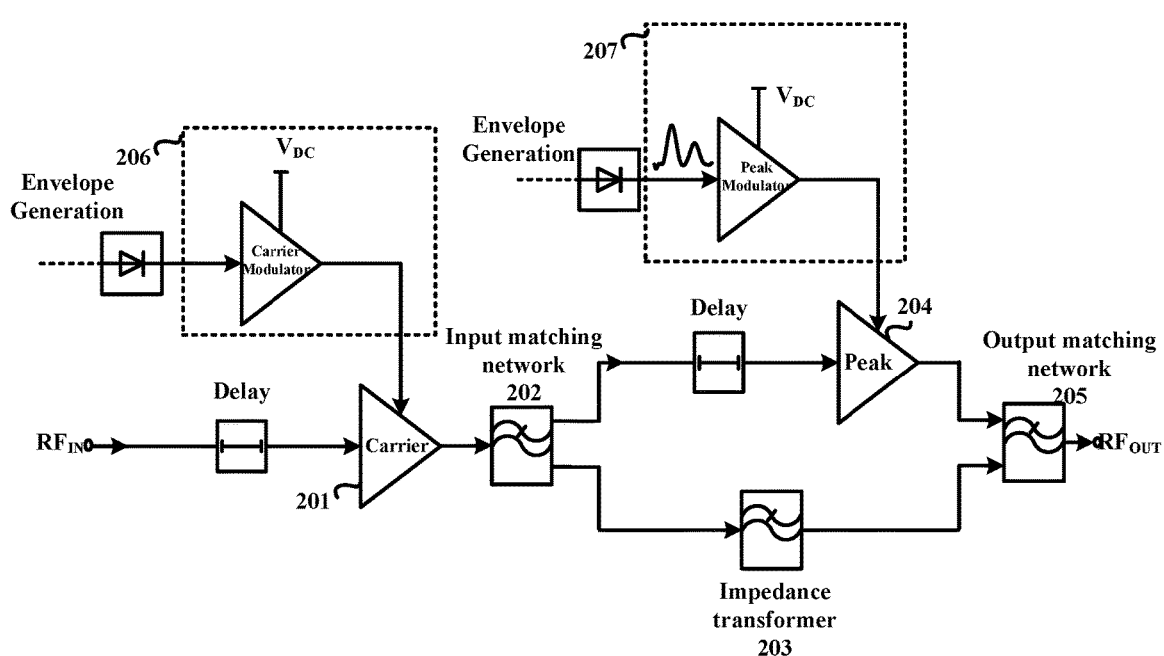
FIG. 2 is a schematic diagram illustrating a power amplifier based on the conventional Doherty amplifier as illustrated in FIG. 1 according to an embodiment of the present disclosure.

FIG. 2 is a schematic diagram illustrating a power amplifier 200 according to the embodiments of the present disclosure, based on the traditional Doherty amplifier as illustrated in FIG. 1.

As illustrated in FIG. 2, the power amplifier 200 includes two amplifiers in serial connection, that is, a carrier amplifier 201 and a peak amplifier 204, which are respectively powered by their own envelope tracking power supplies, i.e., carrier modulator and peak modulator with fixed DC supply ("$V_{DC}$") 206 and 207. The carrier amplifier 201 and the peak amplifier 204 herein are similar to those included in the traditional Doherty amplifier 100.

In operation, the carrier amplifier 201 receives an RF input signal $RF_{IN}$, which may be delayed by a delay circuit similar to the transmission line 103 in FIG. 1, and amplifies the RF input signal $RF_{IN}$. Then the amplified RF input signal $RF_{IN}$ is fed to an input matching network 202, which may then split the amplified RF input signal $RF_{IN}$ in terms of e.g., the power ratio and phase. In this manner, one part of the amplified RF input signal $RF_{IN}$ passes along a peak amplifier path (upper part as shown) and another part of the amplified RF input signal $RF_{IN}$ passes along an impedance transformer path (lower part as shown). In one embodiment, the input matching network 202 is configured to split the amplified RF input signal $RF_{IN}$ according to a ratio of an input impedance of the peak amplifier path to an input impedance of the impedance transformer path. In another embodiment, the input matching network 202 is configured to split the amplified RF input signal $RF_{IN}$ according to an operation of the peak amplifier 204 when it is switched on. In a further embodiment, the input matching network 202 may be implemented as a single-to-differentiated ("S2D") matching network configured to split the amplified RF input signal $RF_{IN}$ from the carrier amplifier 201 and perform impedance matching and phasing operations directed to the peak amplifier path and the impedance transformer path.

For instance, output branches of the input matching network may compensate the phase difference between the peak amplifier and the impedance transformer paths with optimized electrical lengths. Further, the input matching network 202 may coordinate with an output matching network 205 to provide a fully matched path selection between the carrier output terminal and the final output and a compensating phase to reduce both amplitude-modulation (AM/AM) and phase-modulation (AM/PM) variations because the output power level may change and be distorted significantly with phase variations between an impedance transformer 203 and a peak amplifier 204, as discussed below.

The power amplifier 200 further includes the impedance transformer 203 arranged in the impedance transformer path and the peak amplifier 204 arranged in the peak amplifier path. The peak amplifier 204, which is similar to the one included in the traditional Doherty amplifier 100, is configured to be switched on or off based at least in part on the input power level of the RF input signal $RF_{IN}$. According to the embodiments of the present disclosure, it is possible to perform flexible harmonic tuning for carrier and peak amplifiers 201 and 204 with various harmonic open/short combinations to form Class-E/F/F-1/J etc. high efficiency switch mode power amplifier architectures, which own higher peak power efficiencies.

In one embodiment, the impedance transformer 203 may be implemented as an arbitrary phase shift impedance transformer. For example, it may be embodied as a quarter wavelength impedance transformer or transmission line, which may be implemented by e.g., low pass LC networks and configured to perform quarter wavelength impedance transformation and phasing operations. The impedance transformation may relate to impedance matching with the input matching network 202 and the impedance value of the impedance transformer may change correspondingly with the change of the input power level due to self-biasing effect. For example, if the input power level is low, that is, in a low power mode, then the impedance value of the impedance transformer 203 is also relatively low compared to the impedance value of the peak amplifier path such that the amplified RF input signal $RF_{IN}$ mainly passes the impedance transformer path. However, if the input power level is rather high, that is, in a high power mode, then the impedance value of the impedance transformer 203 may become relatively higher than the impedance value of the peak amplifier path such that the peak amplifier 204 is switched on and the amplified RF input signal $RF_{IN}$ mainly passes the peak amplifier path. The phasing operation may relate to phase matching with the output of the peak amplifier 204 such that the output of the peak amplifier path and the impedance transformer path may be in phase and could be combined at the output matching network 205.

In one embodiment, the one part of the amplified RF input signal $RF_{IN}$ passing along the peak amplifier path and the other part of the amplified RF input signal $RF_{IN}$ passing along the impedance transformer path are mutually out of phase by an arbitrary value from 0 to 180 degree, which is more flexible than the prior art with a fixed 90 degree. For example, for subsequent easy combining, the RF input signal $RF_{IN}$ that is presented to the input of the peak amplifier 204 lags the RF input signal $RF_{IN}$ that is presented to the input of the impedance transformer by approximately 45°.

The output matching network 205, in one embodiment, may be implemented as a differentiated-to-single ("D2S") matching network matched with the single-to-differentiated matching network as discussed before and configured to perform signal combining and corresponding impedance matching and phasing operations for such combining and final output towards an antenna (not shown).

In another embodiment, the input matching network 202 and the output matching network 205 are implemented by lumped element networks comprising lumped elements, by distributed parameters, or by a combination of both. For example, a lumped element network is one that includes inductors, capacitors, and resistors as the primary filtering and phase shifting components.

From the technical implementation point of view, the input matching network 202 and the output matching network 205 each may be implemented by a combination of impedance transformers and matching elements. For example, the input matching network 202 and the output matching network 205 each may comprise a plurality of LC circuits, which are to be tuned to the desired frequency of operation and comprise parallel L and C elements, which may be used to remove the phase shifts provided by the carrier amplifier, peak amplifier and the impedance transformer and provide any phase offsets deemed necessary to achieve desired performance metrics. In a further embodiment, the input matching network 202 and the output matching network 205 may be configured to match with each other such that one or more resonances may be produced, resulting in omission of one or more LC pairs. In addition, to design highly efficient matching networks, a person skilled in the art should know about the locus of the input impedance of the peak amplifier path with the input power.

From the above discussion with reference to FIG. 2, it is to be understood that the embodiments of the present disclosure propose the carrier amplifier 201 being connected in series with the peak amplifier 204 through input and output matching networks 202 and 205, instead of the traditional parallel. Doherty topology wherein the carrier amplifier and the peak amplifier are connected in parallel. Hence, the load impedance seen from the carrier amplifier is a parallel combination of the input impedance of the peak amplifier and the inverted output impedance of the active load related to the impedance transformer. By designing the input impedance of the peak amplifier 204 reasonably, the optimum load modulation can be obtained at the carrier amplifier 202, resulting in the desirable efficiency enhancement. Further, with such a series topology, constrains of the Doherty amplifier with regard to broadband applications may be eliminated and multi-mode and multi-band design may be achieved based upon the topology improvements. Additionally, although the carrier and peak amplifiers as depicted in FIG. 2 have their own envelope tracking power supply modulators 206 and 207, that is, the carrier modulator and the peak modulator as shown, a single envelope tracking power supply modulator may be shared by both carrier and peak amplifiers for simplified applications, as shown in FIGS. 3a, 4a, and 5-7.

Figure 3A:
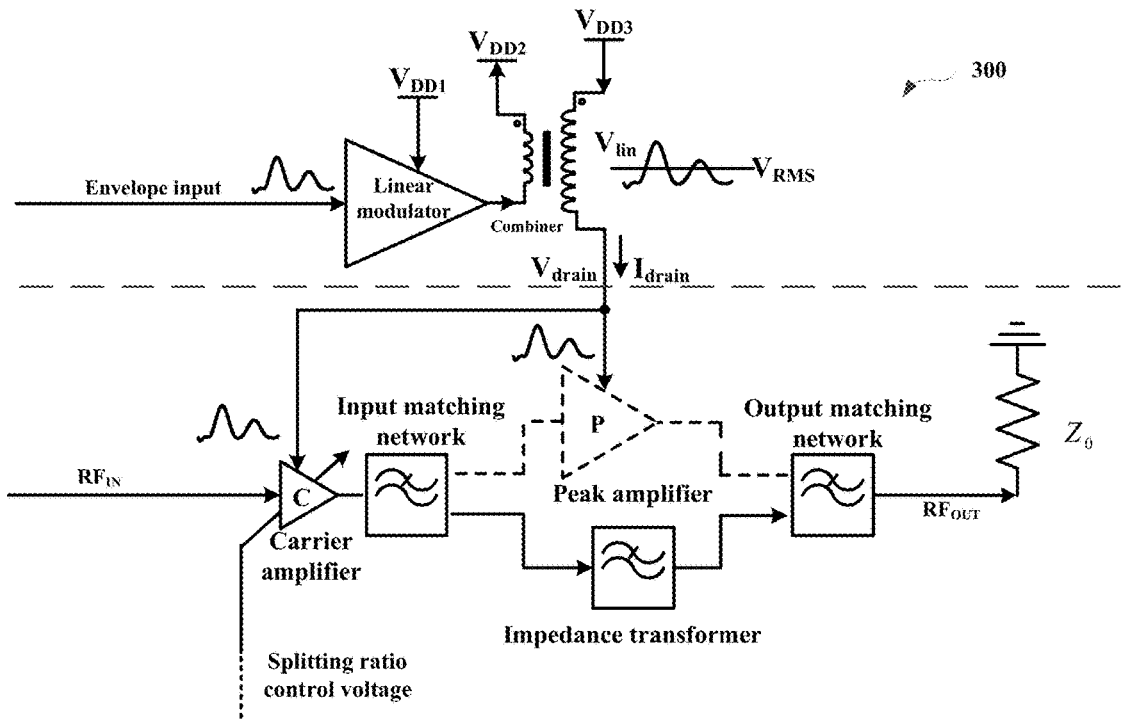
FIG. 3a is a schematic diagram illustrating a power amplifier for amplifying a radio frequency ("RF") signal, which is operating in a low power mode, according to an embodiment of the present disclosure.

FIG. 3a is a schematic diagram illustrating a power amplifier 300 for amplifying a radio frequency ("RF") signal, which is operating in a low power mode, according to an embodiment of the present disclosure.

From the FIG. 3a as separated by the dashed line, it can be seen that the lower part is similar to those in the power amplifier 200 as illustrated in FIG. 2 and the upper part is an envelope tracking power supply which is coupled with the carrier amplifier and the peak amplifier respectively, and supplies a drain power supply voltage and current for the carrier amplifier and the peak amplifier. Since the improved circuit structure based on the Doherty amplifier herein is identical to the one illustrated in FIG. 2, the discussion with regard thereto is omitted for a simplifying purpose. The following will discuss the envelope tracking power supply.

As illustrated, the envelope tracking power supply may consist of a linear modulator, an RF broadband transformer or diplexer, as shown as a combiner. In operation, the envelope signal is directly input to the linear modulator where some amplification is performed. The output of the linear modulator is the alternating current (AC) component of the envelope tracking power supply generated by using small direct current (DC) power supply and subsequently injected into the combiner. The DC component of the envelope tracking power supply may come directly from an external DC power supply with an approximate root mean squared (RMS) value of final output voltage. In this manner, there is no need to consider any Switched Mode Power Supply ("SMPS") related compromises and challenges, especially the efficiency issues. The conjunction of both AC and DC supply components at the combiner results in the envelope tracking signal being capable of biasing the drain/collector of the carrier and peak amplifiers.

Due to the separation of the DC and AC components of the envelope tracking power supply signal, it allows a very simple and low-cost envelope tracking power supply design, which may be based upon simple circuits and low-cost solutions. Further, it can give useful improvements to the overall efficiency, reduce the power consumption, and generate the envelope tracking power supply signal in an inexpensive and compact way.

Based upon the power supplied by the envelope tracking power supply, the power amplifier may operate in a low power mode, in which the peak amplifier is switched off, as illustrated in the dashed line. Therefore, the overall efficiency of the power amplifier 300 is determined predominantly by the efficiency of the carrier amplifier.

Figure 3B:
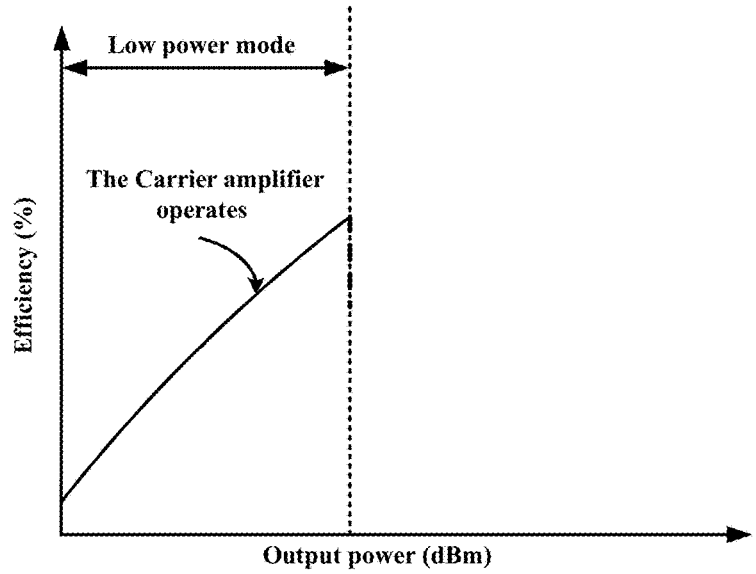
FIG. 3b is a schematic plot of efficiency versus output power for the power amplifier as illustrated in FIG. 3a according to an embodiment of the present disclosure.

FIG. 3b is a schematic plot of efficiency versus output power for the power amplifier 300 as illustrated in FIG. 3a in a low power mode, according to an embodiment of the present disclosure. As illustrated in FIG. 3b, in the low power mode, the carrier amplifier operates and the peak amplifier is shut down. The efficiency of the power amplifier 300 increases proportionally to the output power until the carrier amplifier becomes saturated at a given output power level or reaches its maximum output power.

Figure 4A:
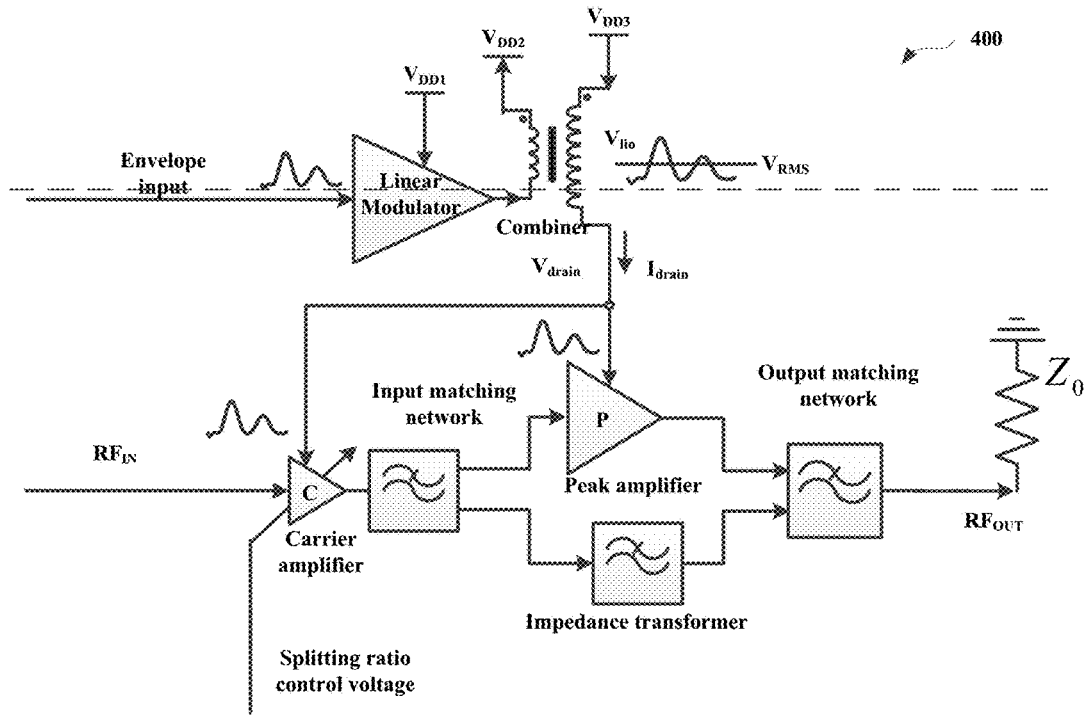
FIG. 4a is a schematic diagram illustrating a power amplifier for amplifying an RF signal, which is operating in a high power mode, according to an embodiment of the present disclosure.

FIG. 4a is a schematic diagram illustrating a power amplifier 400 for amplifying an RF signal, which is operating in a high power mode, according to an embodiment of the present disclosure. It should be noted that the power amplifier 400 has the same circuit structure as the power amplifier 300 except for operating in a different operation mode, i.e., a high power mode.

As discussed before, in the low power mode, the peak amplifier remains off and the RF input signal $RF_{IN}$ increases to a point where the carrier amplifier becomes saturated. With the further increase of the input power, the power amplifier enters into the high power mode and the peak amplifier begins to amplify the RF input signal $RF_{IN}$. In the meantime, the carrier amplifier remains saturated and continues to amplify the RF input signal $RF_{IN}$. As the RF input signal $RF_{IN}$ increases further, the peak amplifier delivers more power until the peak amplifier also becomes saturated at the maximum output power.

Figure 4B:
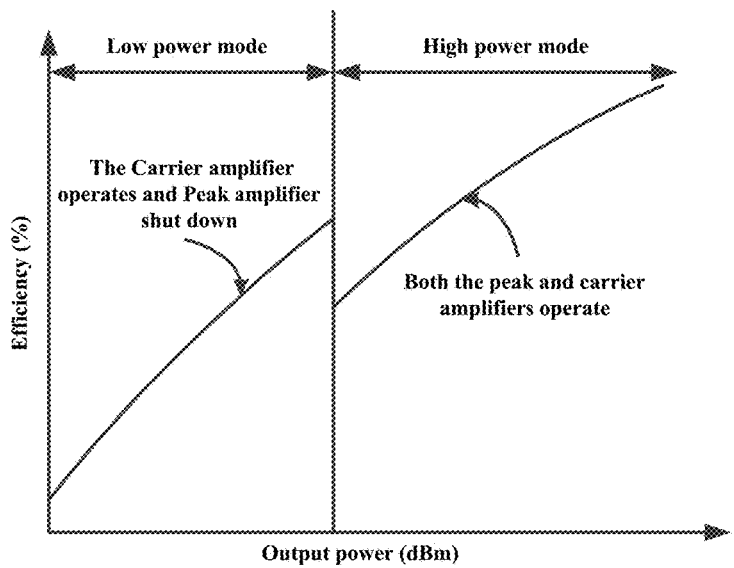
FIG. 4b is a schematic plot of efficiency versus output power for the power amplifier as illustrated in FIG. 4a according to an embodiment of the present disclosure.

FIG. 4b is a schematic plot of efficiency versus output power for the power amplifier 400 as illustrated in FIG. 4a according to an embodiment of the present disclosure. As can be seen from the figure, at the outset, the efficiency of the power amplifier 400 increases proportionally to the output power until the carrier amplifier saturates and reaches its maximum output power. During the low power mode, the peak amplifier remains off and the RF input signal $RF_{IN}$ increases to a point where the carrier amplifier becomes saturated at a given output power level. As the RF input signal $RF_{IN}$ increases past the point where the carrier amplifier becomes saturated, the power amplifier 400 enters into the high power mode. As the high power mode is entered, the peak amplifier begins to amplify the RF input signal $RF_{IN}$. The carrier amplifier remains saturated and continues to amplify the RF input signal $RF_{IN}$. As the RF input signal $RF_{IN}$ increases further, the peak amplifier delivers more power until the peak amplifier becomes saturated at the maximum output power or at a given output power level.

Figure 9:
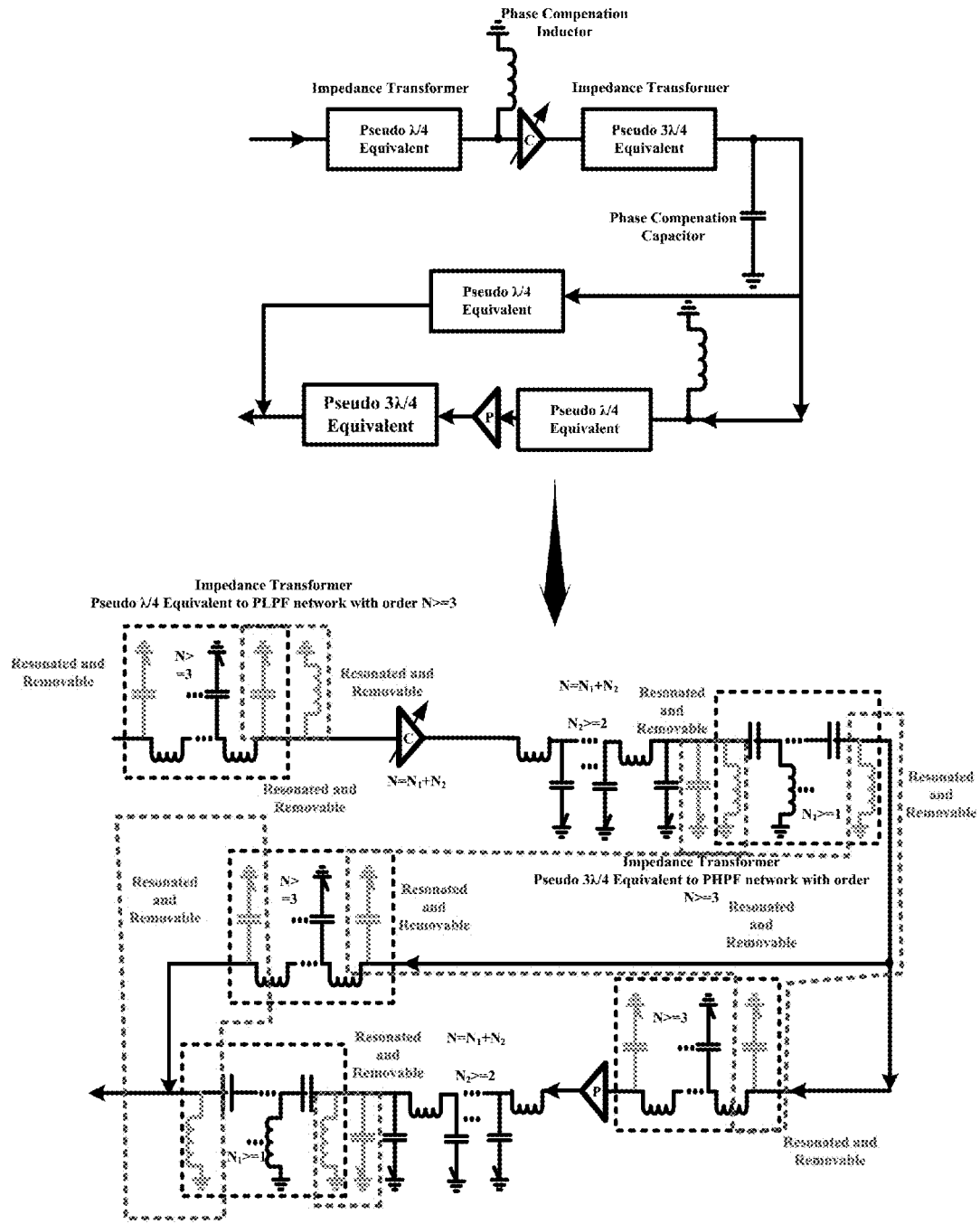
FIG. 9 is a schematic diagram illustrating a possible circuit implementation of the power amplifier according to an embodiment of the present disclosure.

As depicted in FIG. 4b, during the transition from the low power mode to the high power mode, which is also referred to as the transition mode and further shown in FIG. 9, the overall efficiency of the power amplifier 400 is slightly decreased during this transition and then keeps increasing until arrives at the peaks where the peak amplifier becomes saturated.

Figure 5:
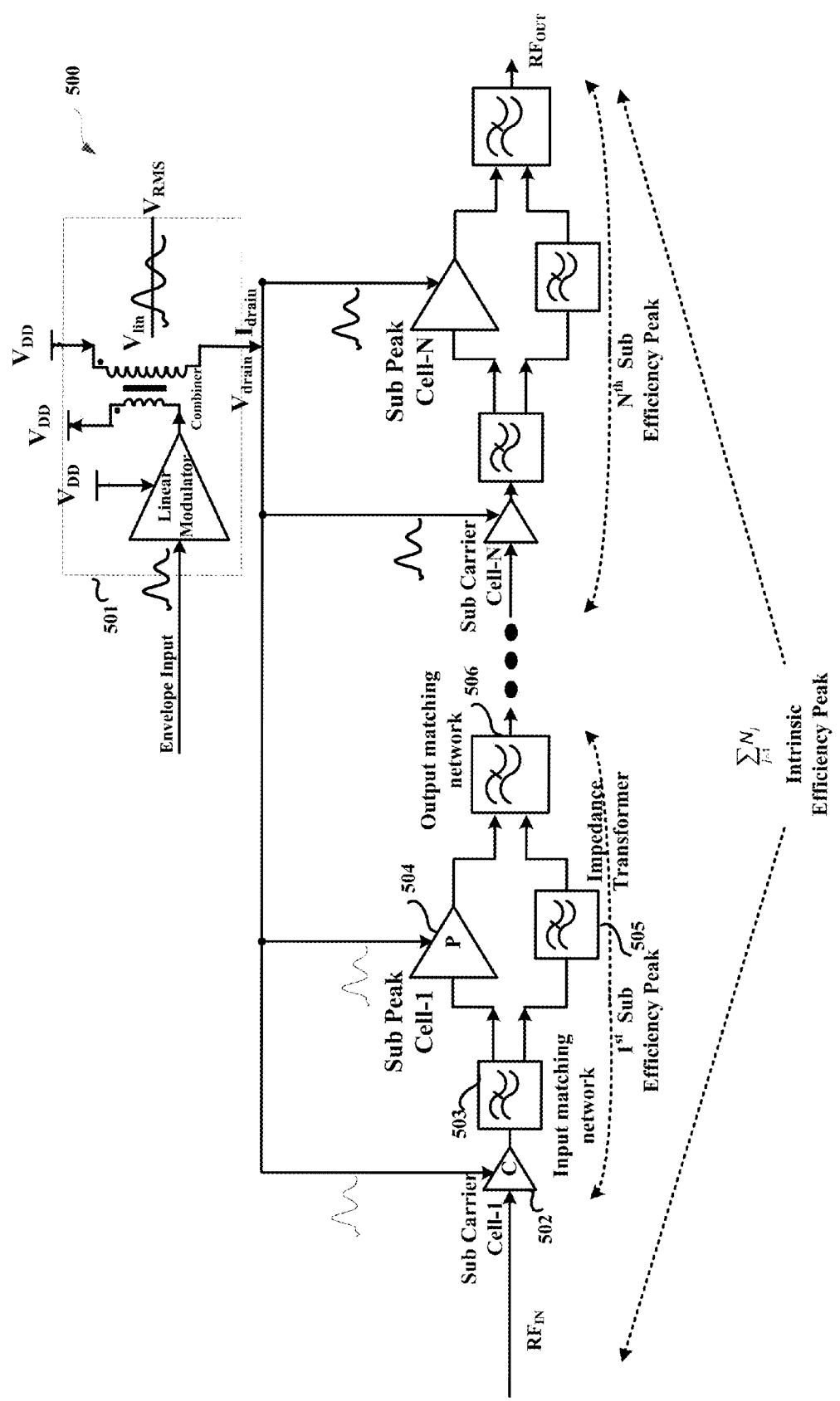
FIG. 5 is a schematic diagram illustrating a serial arrangement multi-stage power amplifier for amplifying an RF signal, wherein each stage includes a power amplifier as illustrated in FIGS. 3a and 4a, according to an embodiment of the present disclosure.
Figure 10:
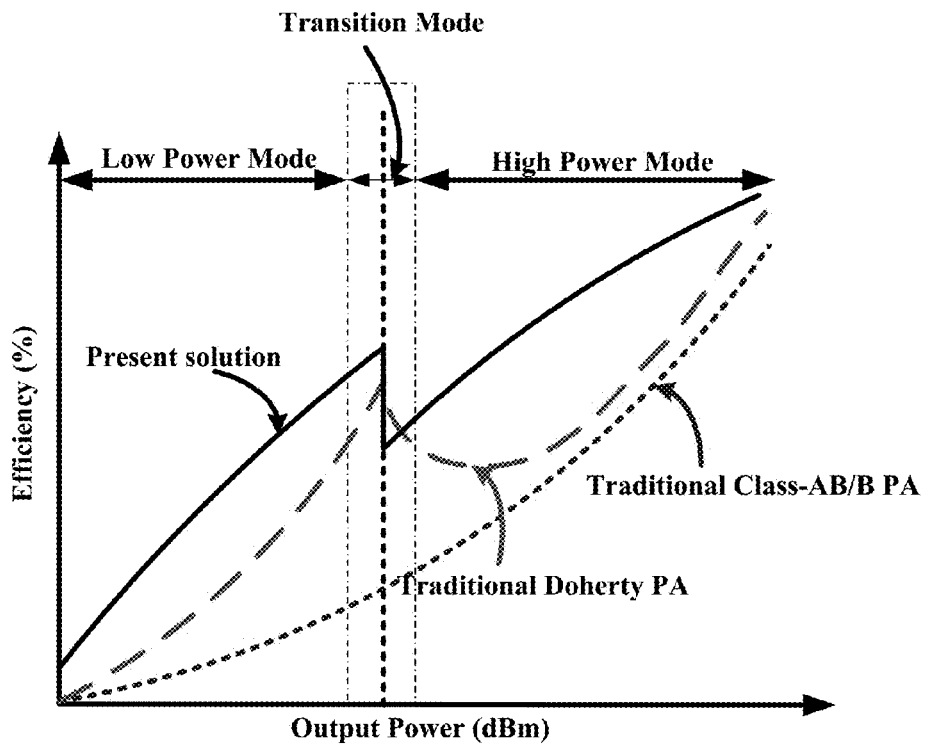
FIG. 10 is a diagram schematically illustrating respective plots of efficiency versus output power for the power amplifier according to the embodiments of the present disclosure, the traditional Doherty power amplifier, and the traditional Class-AB/B power amplifier.

FIG. 5 is a schematic diagram illustrating a serial multi-stage power amplifier 500 for amplifying an RF signal, which includes the envelope-tracking power supply and a plurality of stages, wherein each stage may includes the power amplifiers 300 or 400 as respectively illustrated in FIGS. 3a and 4a, according to an embodiment of the present disclosure. Since each stage may achieve an efficiency peak as illustrated in FIG. 4b, N stages may achieve N efficiency peaks as illustrated in FIG. 10.

Figure 6:
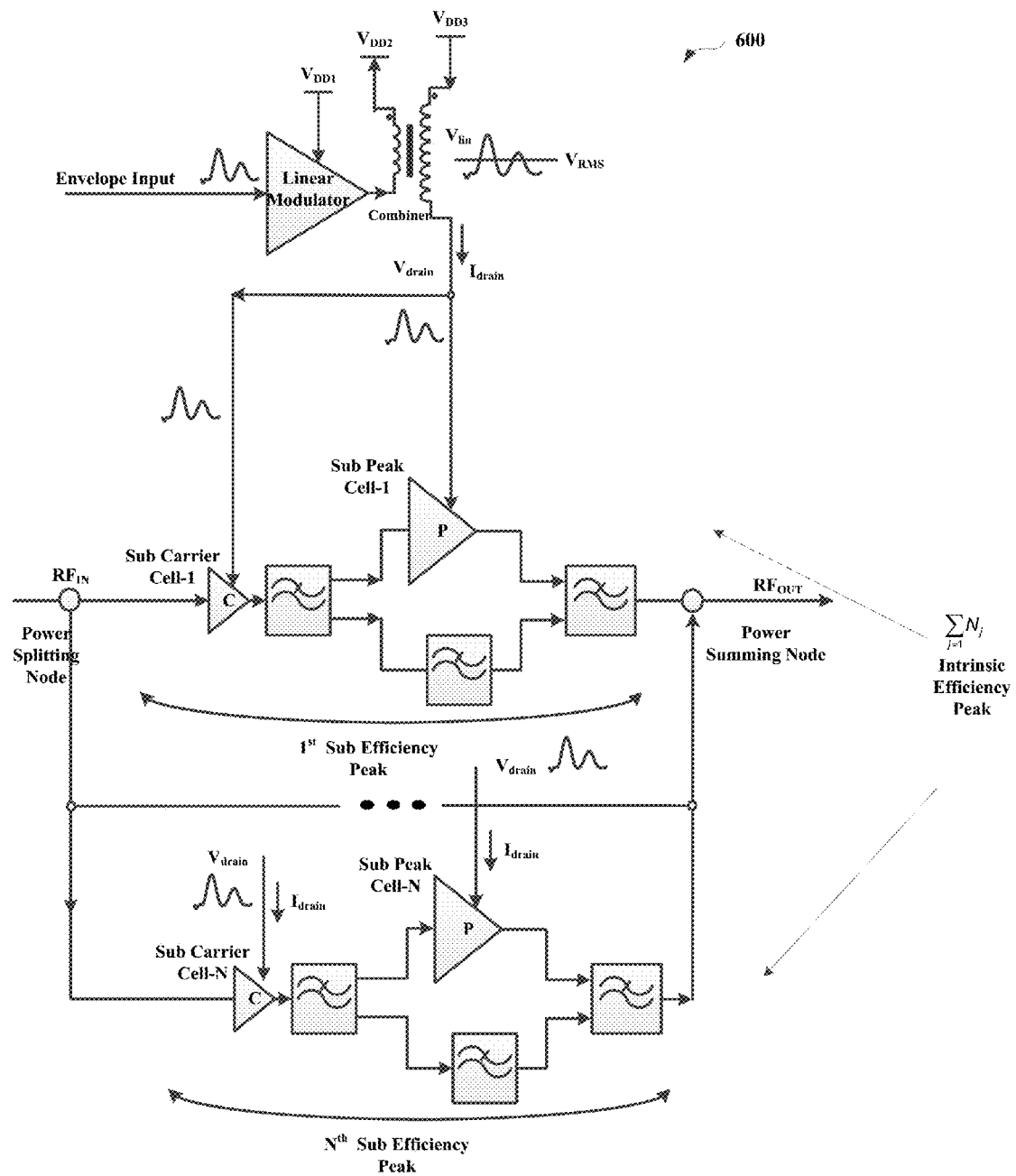
FIG. 6 is a parallel arrangement schematic diagram illustrating a power amplifier for amplifying an RF signal, wherein a plurality of power amplifiers as illustrated in FIGS. 3a and 4a are connected in parallel, according to an embodiment of the present disclosure.

FIG. 6 is a parallel arrangement schematic diagram illustrating a power amplifier 600 for amplifying an RF signal, which includes the envelope-tracking power supply and a plurality of power amplifiers as illustrated in FIGS. 3a and 4a being connected in parallel, according to an embodiment of the present disclosure. It can be seen from FIG. 6, in order to split the RF input signal $RF_{IN}$ and combine the amplified signal from the output of each output matching network, the power amplifier 600 further includes a power splitting node and a power summing node between which the number N of the sub-amplifying circuits, such as the power amplifiers 400, are connected in parallel. Since each sub-amplifying circuit may achieve an efficiency peak as illustrated in FIG. 4b, N sub-amplifying circuits may achieve N efficiency peaks as illustrated in FIG. 10.

Figure 7:
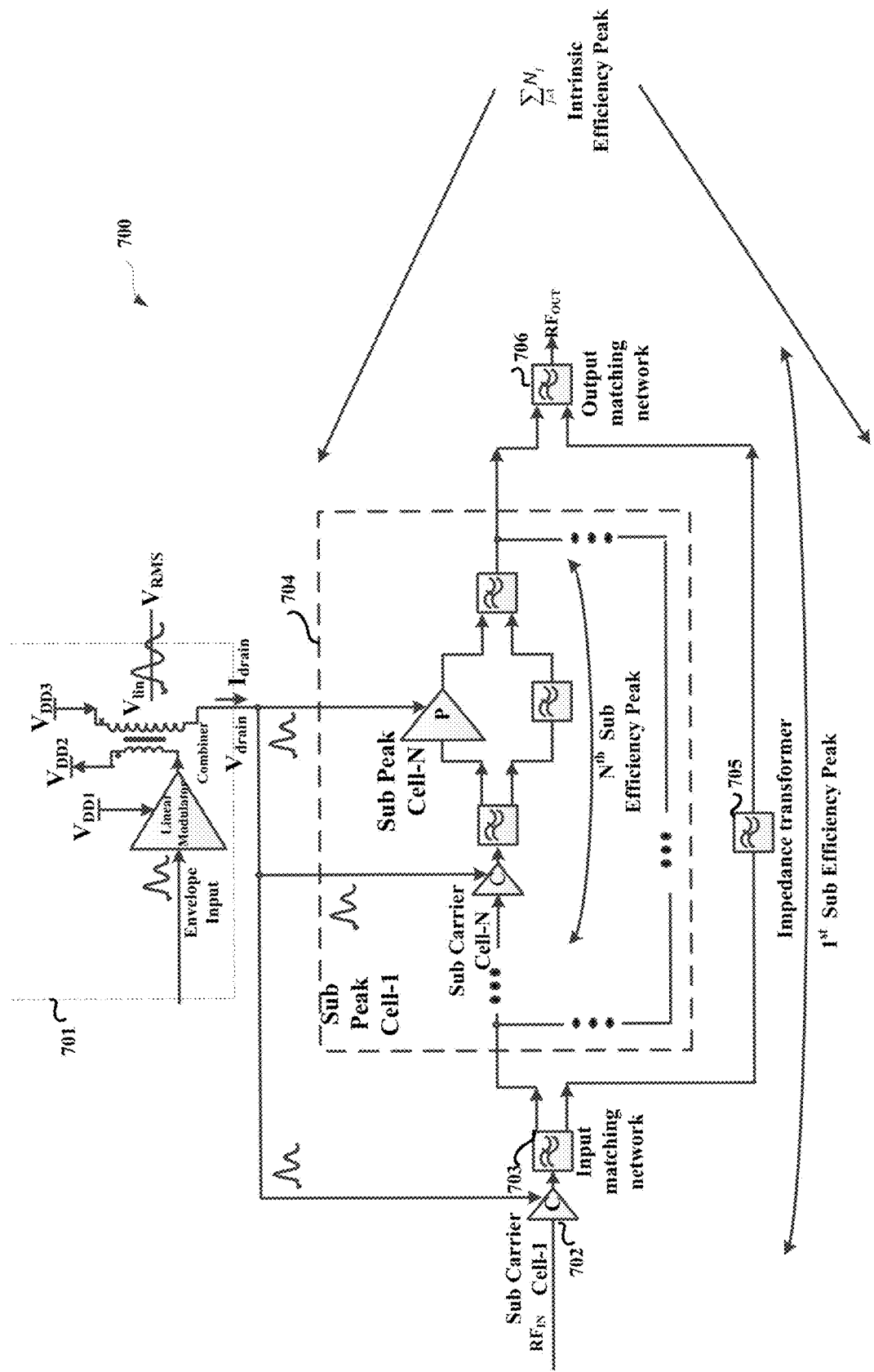
FIG. 7 is a nested arrangement schematic diagram illustrating a power amplifier for amplifying an RF signal, wherein a plurality of power amplifiers as illustrated in FIGS. 3a and 4a are connected in a combination of series and parallel, according to an embodiment of the present disclosure.

FIG. 7 is a nested arrangement schematic diagram illustrating a power amplifier 700 for amplifying an RF signal, which includes the envelope-tracking power supply 701 and a plurality of power amplifiers as illustrated in FIGS. 3a and 4a being connected in a combination of series and parallel, according to an embodiment of the present disclosure.

As illustrated in FIG. 7, the carrier amplifier 702, the input matching network 703, the impedance transformer 705, and the output matching network 706 may be identical or similar to those as discussed before. However, it can be seen from the FIG. 7 that the peak amplifier in the power amplifier 700 may be replaced with or include the power amplifier 400, which is shown by a dashed box 704. That is, the power amplifier 400 may be nested in the power amplifier 700 as a sub-cell. Likewise, in order to achieve a high efficiency, the peak amplifier in the nested path may be further replaced with a basic power amplifier 400. Thus, the power amplifier 700 may be extended in this similar fashion in view of an intended efficiency.

It can be seen from the FIGS. 5-7 that the power amplifiers as proposed by the present disclosure can be provided in many different and flexible ways for efficiency boosting and gain improvement. For example, the power amplifier 500 as depicted in FIG. 5 with the series structure and the power amplifier 700 as depicted in FIG. 7 with the nested structure may be applied for gain boosting. The power amplifier 600 as depicted in FIG. 6 with the parallel structure may be applied for output power level boosting. Therefore, a person skilled in the art is able to understand that the power amplifiers according to the embodiments of the present disclosure may be modular and constituted by hybrid combinations of the basic power amplifier as shown in FIGS. 2, 3a and 4a, and the resulting hybrid combinations should not be limited to FIGS. 5-7. Further, each of these hybrid combinations may be designed for specific system requirements in terms of, for example, output power level and gain.

Figure 8:
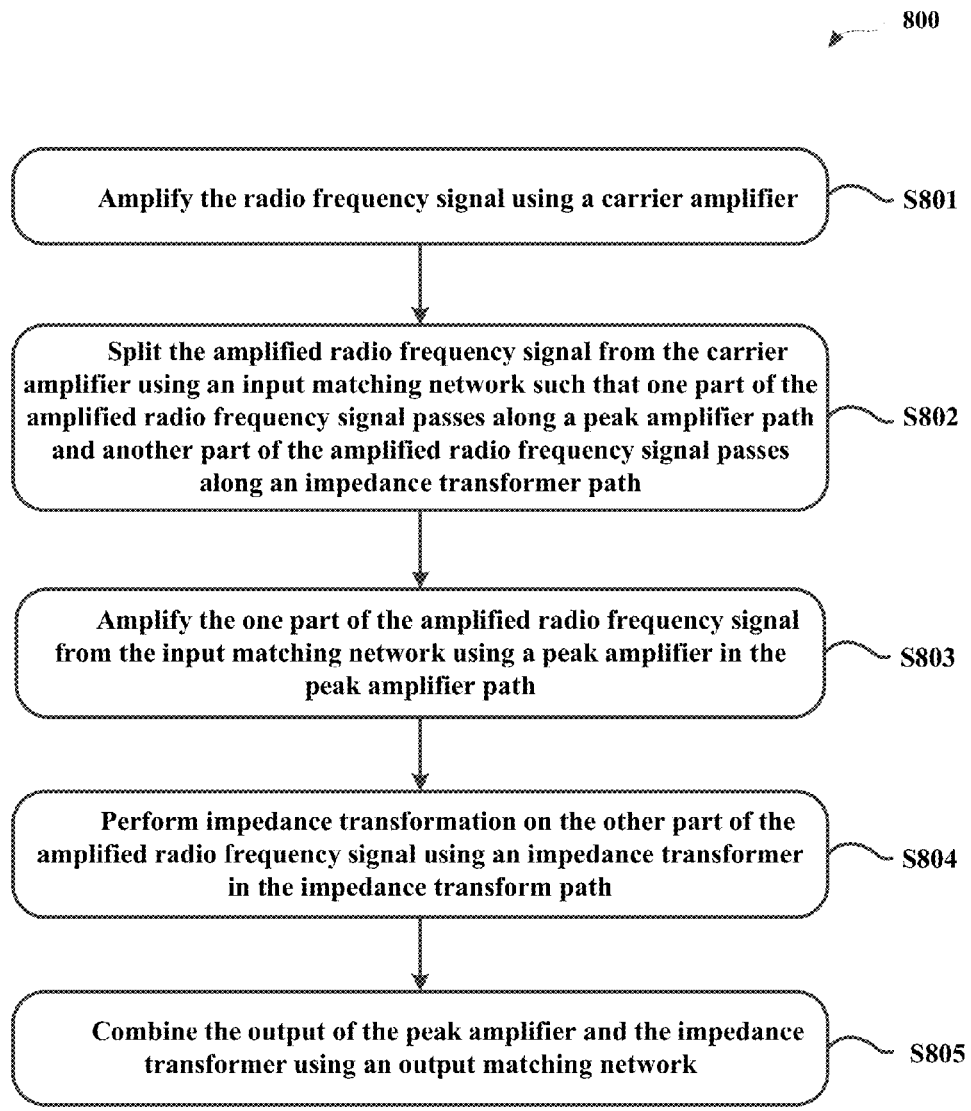
FIG. 8 is a flow chart schematically illustrating a method for amplifying an RF signal according to an embodiment of the present disclosure.

FIG. 8 is a flow chart schematically illustrating a method 800 for amplifying an RF signal according to an embodiment of the present disclosure. As illustrated in FIG. 8, the method 800 amplifies the radio frequency signal using a carrier amplifier at step S801. Then, at step S802, the method 800 splits the amplified radio frequency signal from the carrier amplifier using an input matching network such that one part of the amplified radio frequency signal passes along a peak amplifier path and another part of the amplified radio frequency signal passes along an impedance transformer path. The method 800 amplifies, at step S803, the one part of the amplified radio frequency signal from the input matching network using a peak amplifier in the peak amplifier path. Then, at step S804, the method 800 additionally performs impedance transformation on the other part of the amplified radio frequency signal using an impedance transformer in the impedance transform path. At step S805, the method 800 combines the output of the peak amplifier and the impedance transformer using an output matching network. In the method 800, the carrier amplifier and peak amplifier are powered by an envelope tracking power supply and the peak amplifier is configured to be switched off in a lower power mode and switched on in a high power mode based at least in part on an input power level of the radio frequency signal.

In an embodiment, the output of the envelope tracking power supply is a combination of an alternating current component and a direct current component, and wherein the alternating current component is provided by a linear modulator of the envelope tracking power supply and the direct current component is provided by an external direct current power supply.

In an embodiment, the amplified radio frequency signal is split according to a ratio of an input impedance of the peak amplifier path to an input impedance of the impedance transformer path.

In another embodiment, the amplified radio frequency signal is split according to an operation of the peak amplifier when it is switched on.

In an addition embodiment, the method 800 may further match the input matching network with the output matching network to produce one or more resonances such that one or more LC pairs are omitted.

In yet another embodiment, the input matching network and the output matching network are implemented by lumped element networks comprising lumped elements, by distributed parameters, or by a combination of both.

From the above discussion with reference to FIG. 8, it is to be understood by those skilled in the art that the method 800 may be performed to enable the power amplifier to amplify the RF input signal $RF_{IN}$. In this way, it is possible to provide MMMB-enabled mobile devices or base stations that are capable of supporting various communication standards over multiple frequency bands with less complicated and higher efficient power amplifiers, such as those provided by the present disclosure.

FIG. 9 is a schematic diagram illustrating a possible circuit implementation of the power amplifier according to an embodiment of the present disclosure, in which the upper part of the FIG. 9 shows an exemplary block diagram of the possible circuit implementation and the lower part of the FIG. 9 correspondingly shows an exemplary detailed circuit arrangements. From the illustrated upper part, a person skilled in the art can understand that the input and output matching networks according to the embodiments of the present disclosure can be implemented by one or more quarter wave λ/4 or 3λ/4 impedance transformers or equivalent transformers, as depicted as Pseudo λ/4 or 3λ/4 Equivalent. Further, the λ/4 and 3λ/4 impedance transformer may be equivalent to C-L-C and L-C-L+C-L-C unbalanced high order "Pi" network branches, which are further depicted in the lower part of the FIG. 9.

The lower part of the FIG. 9 schematically detailed circuit arrangement for the λ/4 and 3λ/4 impedance transformer as shown in the upper part. As shown, N represents input branch order, which may be equal to or higher than 3. For the λ/4 branch, it is pseudo-low-pass-filter ("PLPF") network with N>=3. For the 3λ/4 branch, $N_1$ represents pseudo-high-pass-filter ("PHPF") network with order equal to or higher than 1; $N_2$ represents PLPF network with order equal to or higher than 2, wherein N is the sum of $N_1$ and $N_2$ and equal to or higher than 3.

Further, the phase compensation LC pair with λ/4 and 3λ/4 LC "Pi", as indicated by grey color, may be configured to resonate at the centre operating frequency by choose the LC values with the condition as follows:

$$\omega_R = 2\cdot \pi \cdot f_c = \frac{1}{\sqrt{L\cdot C}}$$

$$\sin(2\cdot\varphi(t)) = 2\cdot C\cdot(\text{Output Impedance})\cdot\omega = \frac{2\cdot(\text{Output Impedance})}{L\cdot\omega},$$

where $\omega_R$ denotes an angular frequency of LC resonance; $f_c$ denotes a resonance frequency; L denotes an inductance value for LC resonance; C denotes a capacitance value for LC resonance, $\varphi(t)$ denotes the compensated outphasing angle between peak amplifier path and impedance transformer path such that the mentioned resonance would take place. The above two equations define the condition of counteract effects of LC resonance. By means of this resonance, a couple of pairs of LC components may be omitted, as schematically depicted by the dashed boxes, for network reduction and compactness enhancement.

FIG. 10 is a diagram schematically illustrating respective plots of efficiency versus output power for the power amplifier according to the embodiments of the present disclosure, the traditional Doherty power amplifier, and the traditional Class-AB/B power amplifier. As depicted in FIG. 10, the efficiency of the power amplifier as provided by the present disclosure may achieve the highest efficiency as compared to the traditional Doherty power amplifier and traditional Class-AB/B power amplifier.

Figure 11:
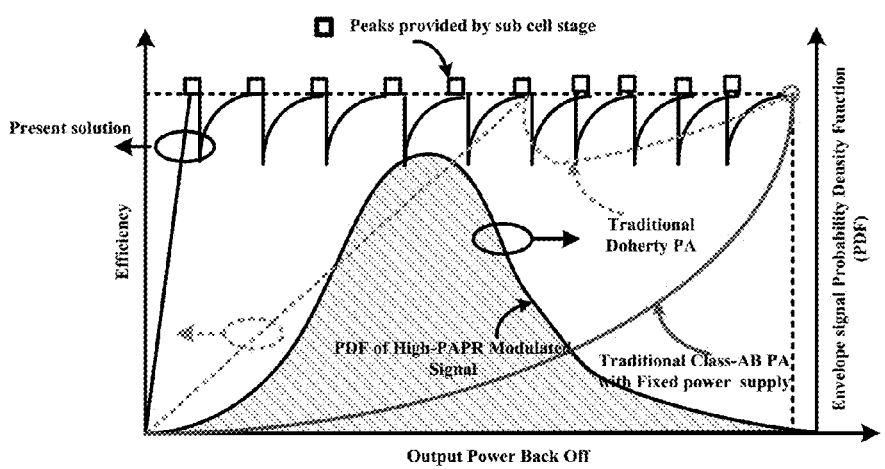
FIG. 11 is a diagram schematically illustrating respective plots of efficiency versus output power back-off characteristics for the power amplifier according to the embodiments of the present disclosure, the traditional Doherty power amplifier, and the traditional fixed direct current (DC) supplied Class-AB power amplifier, taking into account the envelope signal probability density function ("PDF")

FIG. 11 is a diagram schematically illustrating respective plots of efficiency versus output power back-off characteristics with respect to the power amplifier according to the embodiments of the present disclosure, the traditional Doherty power amplifier, and the traditional Class-AB power amplifier, taking into account the envelope signal probability density function ("PDF"). As clearly depicted in FIG. 11, the efficiency as achieved by the power amplifier of the present disclosure significantly maintains at a relatively higher level as compared to the traditional Class-AB power amplifier and the traditional Doherty amplifier. In particular, based upon the probability density function ("PDF") of the envelope signal, it can be found that in the probability distribution range of the envelope signal, the efficiency of the power amplifier of the present disclosure keeps at a high level regardless of whether the probability of the envelope signal is high or low. Further, according to the output power requirement, more sub-amplifying circuit or stage can be added in the power amplifier, which may obtain more efficiency peaks and higher output power. In contrast, the traditional Class-AB power amplifier with the fixed power supply instead of an envelope-tracking power supply according to the present disclosure, achieves the lowest efficiency level. When the output power is backed off, its efficiency is significantly decreased. The traditional Doherty power amplifier, as shown, may achieve a higher efficiency level as compared to the traditional Class-AB power amplifier. However, when the output power is backed off, its efficiency is also notably reduced and cannot maintain a relatively high level in the probability distribution range of the envelope signal.

Figure 12:
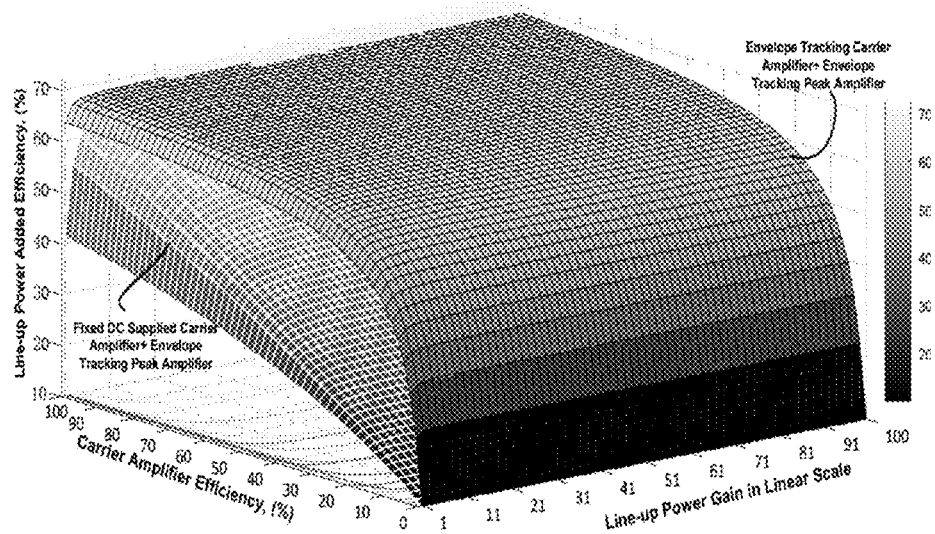
FIG. 12 is a diagram schematically illustrating line-up power added efficiency character plot versus carrier amplifier power gain and its drain efficiency according to the embodiments of the present disclosure.

FIG. 12 is a diagram schematically illustrating line-up power added efficiency character plot versus carrier amplifier power gain and its drain efficiency according to the embodiments of the present disclosure. As shown in FIG. 12, the overall efficiency as achieved by a line-up combination of a fixed DC supplied carrier amplifier and an envelope tracking power supplied peak amplifier would drop dramatically with the efficiency of the carrier amplifier. However, with the solutions of the present disclosure, both carrier and peak amplifiers are operating by using the envelope tracking power supply as the power supply so that the relationship between line-up power added efficiency (PAE) and carrier amplifier efficiency would be transformed into a constant. This means that the line-up power added efficiency would remain high and tolerate more carrier efficiency degradations. Also, due to the line-up gain increase, there is a minor efficiency drop for a low-gain final amplification stage compared to conventional Doherty power amplifier.

As will be appreciated by one skilled in the art, the input and output matching networks according to the embodiments of the present disclosure are merely exemplary and may be implemented in higher order (second and third order) networks of various configurations so as to better optimize the phase differences between the peak amplifier path and impedance transformer paths as well as provide improved input and output matching to achieve desired performance characteristics at maximum and backed-off power levels. Notably, the effective bandwidth of the power amplifier can be dramatically increased over what has been achieved by the conventional Doherty amplifier while maintaining high efficiency at maximum and backed-off power levels.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Many modifications and other embodiments of the disclosures set forth herein will come to mind to one skilled in the art to which these embodiments of the disclosure pertain having the benefit of the teachings presented in the foregoing descriptions and the associated drawings. Therefore, it is to be understood that the embodiments of the disclosure are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A power amplifier for amplifying a radio frequency signal, the power amplifier comprising:
an envelope tracking power supply comprising
a linear modulator configured to receive an envelope signal and provide an alternating current component, and a combiner configured to receive the alternating current component from the linear modulator, receive a direct current component from an external direct current power supply, and provide an envelope tracking power supply signal comprising the alternating current component and the direct current component;
a carrier amplifier coupled with the envelope tracking power supply and configured to amplify the radio frequency signal, the carrier amplifier powered by the envelope tracking power supply signal;
an input matching network configured to split the amplified radio frequency signal from the carrier amplifier such that one part of the amplified radio frequency signal passes along a peak amplifier path and another part of the amplified radio frequency signal passes along an impedance transformer path;
a peak amplifier coupled with the envelope tracking power supply and configured to amplify the one part of the amplified radio frequency signal from the input matching network, the peak amplifier powered by the envelope tracking power supply signal;
an impedance transformer configured to perform impedance transformation on the other part of the amplified radio frequency signal from the input matching network;
an output matching network configured to combine the output of the peak amplifier and the impedance transformer; and,
wherein the peak amplifier is configured to be switched off to a lower power mode and switched on to a high power mode by the envelope tracking power supply signal based at least in part on an input power level of the radio frequency signal.

2. The power amplifier according to claim 1, wherein the input matching network is configured to split the amplified radio frequency signal according to a ratio of an input impedance of the peak amplifier path to an input impedance of the impedance transformer path.

3. The power amplifier according to claim 1, wherein the input matching network is configured to split the amplified radio frequency signal according to an operation of the peak amplifier when it is switched on.

4. The power amplifier according to claim 1, wherein the input matching network and the output matching network are matched with each other to produce one or more resonances such that one or more LC pairs are omitted.

5. The power amplifier according to claim 1, wherein the input matching network and the output matching network are implemented by lumped element networks comprising lumped elements, by distributed parameters, or by a combination of both.

6. The power amplifier according to claim 1, wherein the one part of the amplified radio frequency signal passing along the peak amplifier path and the other part of the amplified radio frequency signal passing along the impedance transformer are mutually out of phase by an arbitrary value from 0 to 180 degree.

7. A multi-stage power amplifier for amplifying a radio frequency signal, the multi-stage power amplifier comprising:
an envelope tracking power supply comprising
a linear modulator configured to receive an envelope signal and provide an alternating current component, and a combiner configured to receive the alternating current component from the linear modulator, receive a direct current component from an external direct current power supply, and provide an envelope tracking power supply signal comprising the alternating current component and the direct current component;

a plurality of stages, each stage comprising:

a carrier amplifier coupled with the envelope tracking power supply and configured to amplify the radio frequency signal, the carrier amplifier powered by the envelope tracking power supply signal;

an input matching network configured to split the amplified radio frequency signal from the carrier amplifier such that one part of the amplified radio frequency signal passes along a peak amplifier path and another part of the amplified radio frequency signal passes along an impedance transformer path;

a peak amplifier coupled with the envelope tracking power supply and configured to amplify the one part of the amplified radio frequency signal from the input matching network, the peak amplifier powered by the envelope tracking power supply signal;

an impedance transformer configured to perform impedance transformation on the other part of the amplified radio frequency signal from the input matching network;

an output matching network configured to combine the output of the peak amplifier and the impedance transformer for input to a next stage, wherein the peak amplifier is configured to be switched off to a lower power mode and switched on to a high power mode by the envelope tracking power supply signal based at least in part on an input power level of the radio frequency signal.

8. The multi-stage power amplifier according to claim 7, wherein the input matching network is configured to split the amplified radio frequency signal according
to a ratio of an input impedance of the peak amplifier path to an input impedance of the impedance transformer path.

9. The multi-stage power amplifier according to claim 7, wherein the input matching network is configured to split the amplified radio frequency signal according to an operation of the peak amplifier when it is switched on.

10. The multi-stage power amplifier according to claim 7, wherein the input matching network, and the output matching network are matched with each other to produce one or more resonances such that one or more LC pairs are omitted.

11. The multi stagy power amplifier according W claim 7, wherein the input matching network and the output matching network are implemented by lumped element networks comprising lumped elements, by distributed parameters, or by a combination of both.

12. The multi-stage power amplifier according to claim 7, wherein the one part of the amplified radio frequency signal passing along the peak amplifier path and the other part of the amplified radio frequency signal passing along the impedance transformer are mutually out of phase by an arbitrary value from 0 to 180 degree.

13. A method for amplifying a radio frequency signal, the method comprising:

receiving an envelope signal at linear modulator and providing, an alternating current component;

receiving the alternating current component and a direct current component from an external direct current power supply at a combiner;

providing an envelope tracking power supply signal from the combiner, the envelope tracking power supply signal comprising the alternating current component and the direct current component;

amplifying the radio frequency signal using a carrier amplifier, wherein the carrier amplifier is powered by the envelope tracking power supply signal;

splitting the amplified radio frequency signal from the carrier amplifier using an input matching network such that one part of the amplified radio frequency signal passes along a peak amplifier path and another part of the amplified radio frequency signal passes along an impedance transformer path;

amplifying the one part of the amplified radio frequency signal from the input matching network using a peak amplifier in the peak amplifier path, wherein the peak amplifier is powered by the envelope tracking power supply signal and the peak amplifier is configured to be switched off to a lower power mode and switched on to a high power mode by the envelope tracking power supply signal based at least in part on an input power level of the radio frequency signal;

performing impedance transformation on the other part of the amplified radio frequency signal using an impedance transformer in the impedance transform path; and combining the output of the peak amplifier and the impedance transformer using an output matching network.

14. The method according, to claim 13, wherein the amplified radio frequency signal is split according, to a ratio of an input impedance of the peak amplifier path to an input impedance of the impedance transformer path.

15. The method according to claim 13, wherein the amplified radio frequency signal is split according to an operation of the peak amplifier when it is switched on.

16. The method according to claim 13, further comprising:

matching the input matching network with the output matching network to produce one or more resonances such that one or more LC pairs are omitted.

17. The method according to claim 13, wherein the input matching network and the output matching network are implemented by lumped element networks comprising lumped elements, by distributed parameters, or by a combination of both.

* * * * *